United States Patent
Parulkar

(10) Patent No.: US 7,657,804 B2
(45) Date of Patent: Feb. 2, 2010

(54) PLESIOCHRONOUS TRANSMIT PIN WITH SYNCHRONOUS MODE FOR TESTING ON ATE

(75) Inventor: Ishwardutt Parulkar, San Francisco, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 644 days.

(21) Appl. No.: 11/582,803

(22) Filed: Oct. 18, 2006

(65) Prior Publication Data

US 2008/0115021 A1    May 15, 2008

(51) Int. Cl.
*G01R 31/28*    (2006.01)

(52) U.S. Cl. .......................................... 714/724; 714/30

(58) Field of Classification Search .............. 370/230.1, 370/539, 506, 466; 709/201; 714/724, 30
See application file for complete search history.

(56) References Cited

U.S. PATENT DOCUMENTS

| | | | |
|---|---|---|---|
| 5,706,285 A * | 1/1998 | Saijonmaa et al. | 370/230.1 |
| 6,487,223 B1 * | 11/2002 | Tanonaka | 370/539 |
| 6,493,320 B1 | 12/2002 | Schober | |
| 6,777,971 B2 | 8/2004 | Kirloskar | |
| 7,113,489 B2 * | 9/2006 | Lindsey et al. | 370/276 |
| 7,117,241 B2 * | 10/2006 | Bloch et al. | 709/201 |
| 7,194,059 B2 | 3/2007 | Wong | |
| 7,292,608 B1 * | 11/2007 | Nowell et al. | 370/506 |
| 7,551,642 B2 * | 6/2009 | Ito et al. | 370/466 |
| 2008/0010569 A1 * | 1/2008 | Whetsel | 714/724 |

* cited by examiner

*Primary Examiner*—David Ton
(74) *Attorney, Agent, or Firm*—Robert C. Kowert; Meyertons, Hood, Kivlin, Kowert & Goetzel, P.C.

(57) ABSTRACT

A method and apparatus for conveying test response data from an integrated circuit to ATE via a plesiochronous interconnect. The integrated circuit includes a core logic unit and a first transmitter coupled thereto by a first data path. In a normal mode, data conveyed from the core logic unit to the transmitter may be transmitted plesiochronously over an interconnect coupled to the transmitter output. The integrated circuit further includes a second data path coupled between the core logic unit and the interconnect. During a test mode, test response data may be conveyed from the core logic unit to ATE via the second data path and the interconnect, wherein the test response data is synchronously transmitted over the interconnect.

20 Claims, 5 Drawing Sheets

PLESIOCHRONOUS TRANSMIT PIN WITH SYNCHRONOUS MODE FOR TESTING ON ATE

BACKGROUND OF THE INVENTION

1. Field of the Invention

This invention related to integrated circuits, and more particularly, to the testing of integrated circuits having I/O pins that support for plesiochronous interconnects.

2. Description of the Related Art

Plesiochronous signaling is a form of high-speed signaling capable of enabling chip-to-chip communications having transfer rates of up to 10 Gbits/s over a single interconnection. As such, plesiochronous links are capable of significantly higher data transfer speeds than traditional synchronous links (synchronized to a global clock) or source synchronous links (synchronized by a clock transmitted concurrently with the data). Instead of relying on a separate clock signal, plesiochronous links utilize an embedded clock signal, which is recovered from transmitted data by a clock-and-data recovery (CDR) circuit.

Due to the obvious speed advantages of plesiochronous links, many systems now utilize integrated circuits (IC's) configured to communicate with each other in this manner. However, configuring the I/O pins of an integrated circuit package for plesiochronous communications may present a significant obstacle to performing manufacturing tests thereupon.

Manufacturing tests of integrated circuits on automated test equipment (ATE) requires the ATE to be able to compare chip responses on output pins repeatedly on a per clock cycle basis. These chip responses are generated by logic internal to the integrated circuit (i.e. core logic). Comparisons of expected responses by the core logic to the actual responses require the use of a reference clock in the ATE. However, transmitter circuitry configured for plesiochronous transmission of signals does not satisfy this requirement since plesiochronous signaling does not rely on a clock. Furthermore, since ATE does not have the capability of recovering a clock from the data stream, a typical ATE system cannot interpret data received from a plesiochronous transmitter pin.

To work around this limitation, IC's configured to transmit data plesiochronously may include dedicated test pins that can synchronously transfer responses to ATE. However, this solution is expensive, as it consumes silicon area on the die and pin count on the IC package. Furthermore, the number of dedicated test pins may be limited by other specifications of the IC. Limiting the number of dedicated test pins may in turn reduce the communications bandwidth between the IC and the ATE, increase the amount of time necessary to test the IC, or cause a reduction in the amount of testing that can be performed. Thus, for IC's configured to transmit signals plesiochronously, testing may be significantly constrained.

SUMMARY OF THE INVENTION

A method and apparatus for conveying test response data from an integrated circuit (IC) to ATE via a plesiochronous pin and interconnect is disclosed. In one embodiment, an IC includes a core logic unit and a first transmitter coupled thereto by a first data path. In a normal mode, data conveyed from the core logic unit to the transmitter may be transmitted plesiochronously over an interconnect coupled to the transmitter output. The IC further includes a second data path coupled between the core logic unit and the interconnect. During a test mode, test response data may be conveyed from the core logic unit to ATE via the second data path and the interconnect, wherein the test response data is synchronously transmitted over the interconnect.

In one embodiment, the method includes operating in a normal mode and a test mode. In the normal mode, data is transmitted plesiochronously over an interconnect, wherein the data is conveyed from core logic, over a first data path, to a transmitter and then transmitted over the interconnect. In a test mode, test response data (indicating a response to a test stimulus provided by ATE) is transmitted synchronously over the same interconnect. The interconnect may provide a transmission path from the IC to the ATE for either a differential channel or two single-ended channels. In the differential channel embodiments, the second data path may be coupled between the core logic unit and the transmitter, with a selector circuit selecting the second data path when in the test mode.

In embodiments configured with two single-ended channels, second and third transmitters and a third data path may also be present. Test response data may be conveyed over the second data path and transmitted by the second transmitter through a first pin connection of the interconnect, while test response data may also be conveyed over the third data path to the third transmitter, wherein it is transmitted through a second pin connection of the interconnect. The transmission of test response data by the second and third transmitters may occur independently of one another, although both may be synchronized to a clock generated by the core logic unit.

Thus, the method and apparatus disclosed herein enables the dual use of the pins of a plesiochronous interconnect for plesiochronous data transmissions in a normal mode and for synchronous transmission of test response data to ATE in a test mode. This dual use of the pins that are normally used for plesiochronous transmissions may eliminate the need to add dedicated test pins for transferring test response data to an ATE.

BRIEF DESCRIPTION OF THE DRAWINGS

Other aspects of the invention will become apparent upon reading the following detailed description and upon reference to the accompanying drawings in which.

Figure 1:
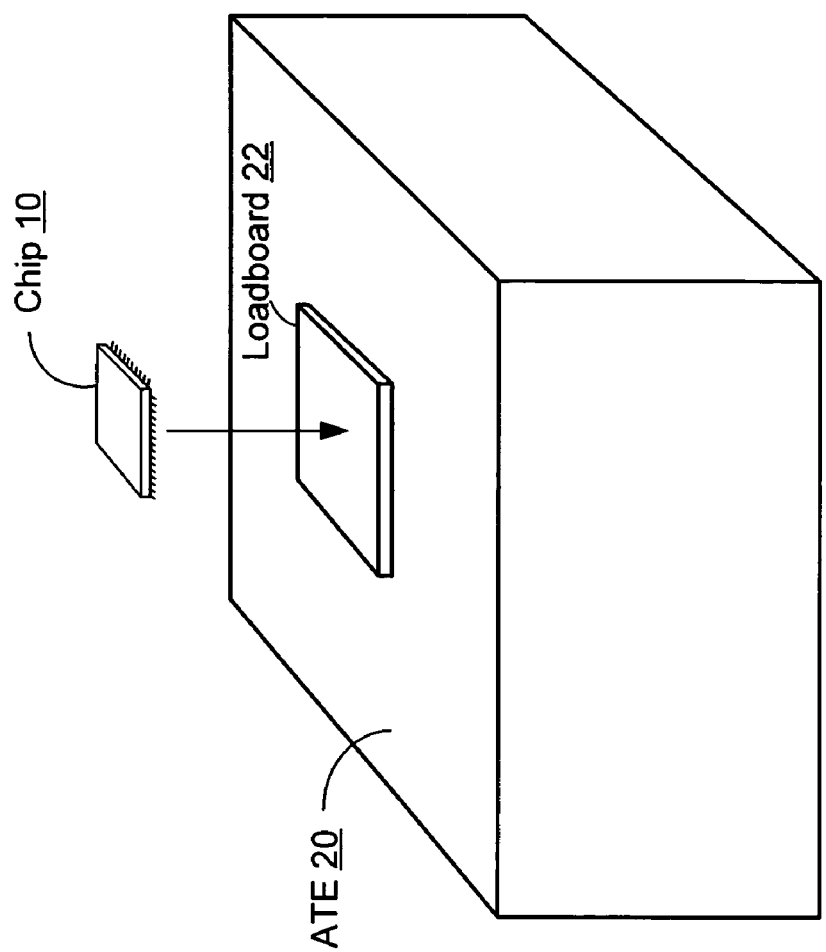
FIG. 1 is a drawing of one embodiment of an ATE (automated test equipment) system configured for testing integrated circuits (IC's)

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

FIG. 1 is a drawing of one embodiment of an ATE (automated test equipment) system configured for testing integrated circuits (IC's). In the embodiment shown, automated test equipment (ATE) 20 is a test system configured for testing integrated circuits, such as chip 10. ATE 20 includes a loadboard 22 configured for coupling chip 10 to ATE 20. Loadboard 22 is configured to provide electrical connections between ATE 20 and chip 10, and may provide any electrical loading or termination necessary to ensure the integrity of signals transferred therebetween. ATE 20 is configured to provide test signals and stimulus to chip 10, and is further configured to receive and analyze test response signals and data received from chip 10.

Chip 10 is an integrated circuit package having one or more die, packaging, and pin connections. The package and pin connections may comprise a ball grid array, pin grid array, quad flat pack, or any other type of packaging/pin connection arrangement that may be suitable for the integrated circuit die packaged therein. Chip 10 may comprise virtually any type of integrated circuit, such as a microprocessor, a digital signal processing chip, an application specific integrated circuit (ASIC) or other type. ATE 20 is configured to test the functionality of chip 10, its electrical characteristics, or both.

Figure 2:
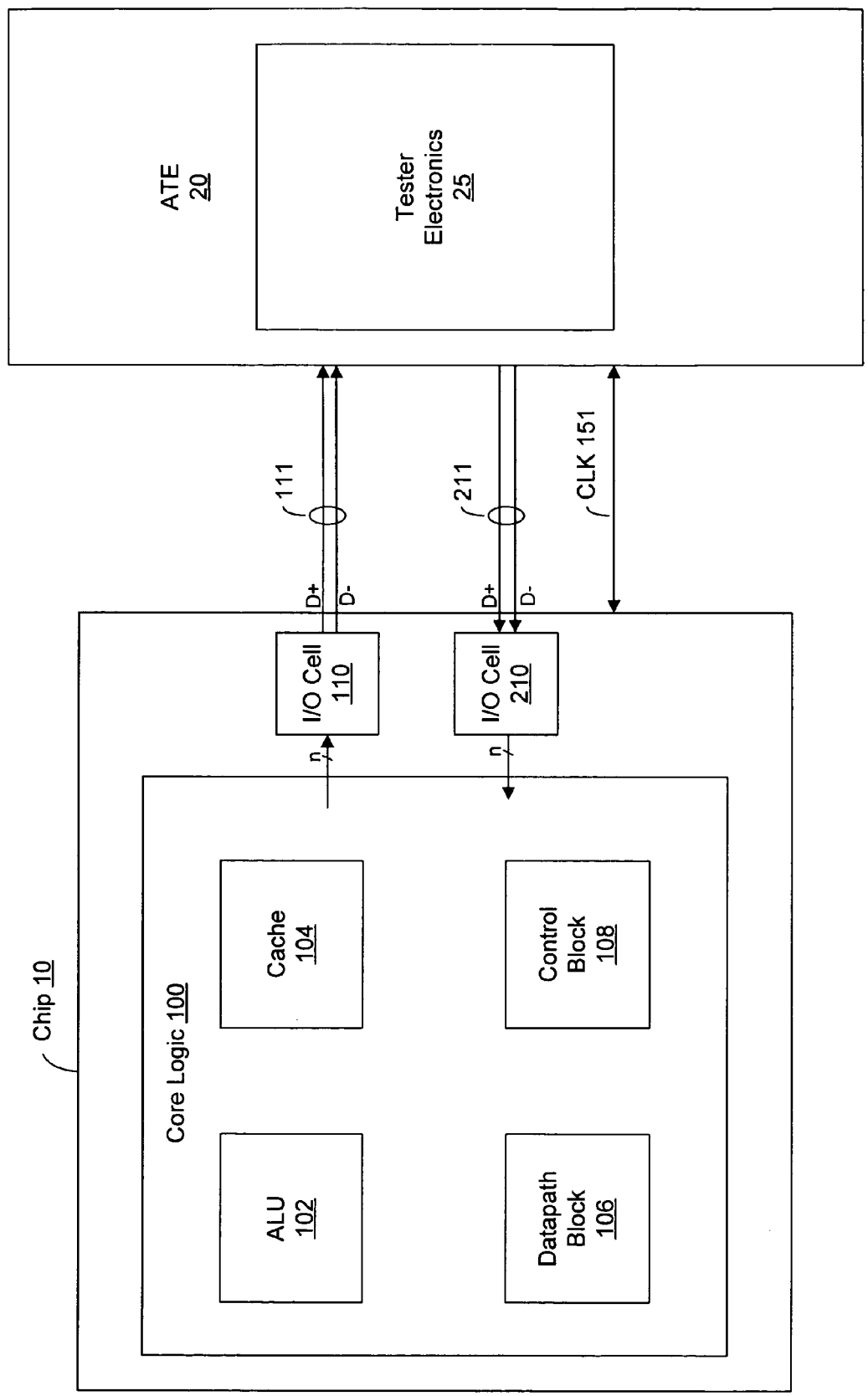
FIG. 2 is a block diagram of one embodiment of an ATE system coupled to an IC configured for being tested thereupon.

FIG. 2 is a block diagram of one embodiment of an ATE system coupled to an IC configured for being tested thereupon. In the embodiment shown, chip 10 and ATE 20 are coupled by a plurality of interconnections. The interconnections in this example are differential interconnections, and thus chip 10 includes first and second pins for each. For the sake of simplicity, only two interconnections are shown in this example, although it is to be understood that the exact number of interconnections may be greater and is limited only by the specific configuration of ATE 20 and chip 10.

In the embodiment shown, ATE 20 may send test stimulus data to chip 10 through one or more interconnections 211. Each of interconnections 211 is a differential interconnection, and is thus configured to receive a true signal (D+) and a complementary signal (D−). The test stimulus data may be received serially by I/O cell 210, converted into parallel data, and conveyed to core logic 100. In a normal mode of operation (i.e. when chip 10 is operating in its target system), I/O cell 210 is configured to receive data transmitted plesiochronously. However, in a test mode (i.e. when being tested on ATE 20), chip 10 may synchronously receive test stimulus data from ATE 20. The test stimulus data may be synchronized to a clock signal conveyed from ATE 20 to chip 10 via clock interconnection 151.

ATE 20 may receive test response data from chip 10 via one or more interconnections 111. Each of interconnections 111 is a differential interconnection, and is thus configured to transmit a true signal (D+) and a complementary signal (D−). The test response data may be conveyed in parallel from core logic 100 to I/O cell 110 and then transmitted serially over interconnect 111. During a normal mode of operation (i.e. when chip 10 is operating in its target system) chip 10 is configured to transmit data plesiochronously from I/O cell 110 over interconnect 1.11. However, in a test mode (i.e. when being tested on ATE 20), chip 10 may synchronously transmit test response data from to ATE 20. The test response data may be synchronized to a clock signal conveyed from core logic 100 of chip 10 to ATE via clock interconnection 151.

Chip 10 includes various type of functionality that may be tested by ATE 20. In this particular example, core logic 100 of chip 10 includes arithmetic logic unit 102, cache 104, datapath block 106, and control 108. Other or different types of functionality may be included, and the types of functionality shown in this example are not intended to be limiting.

Figure 3:
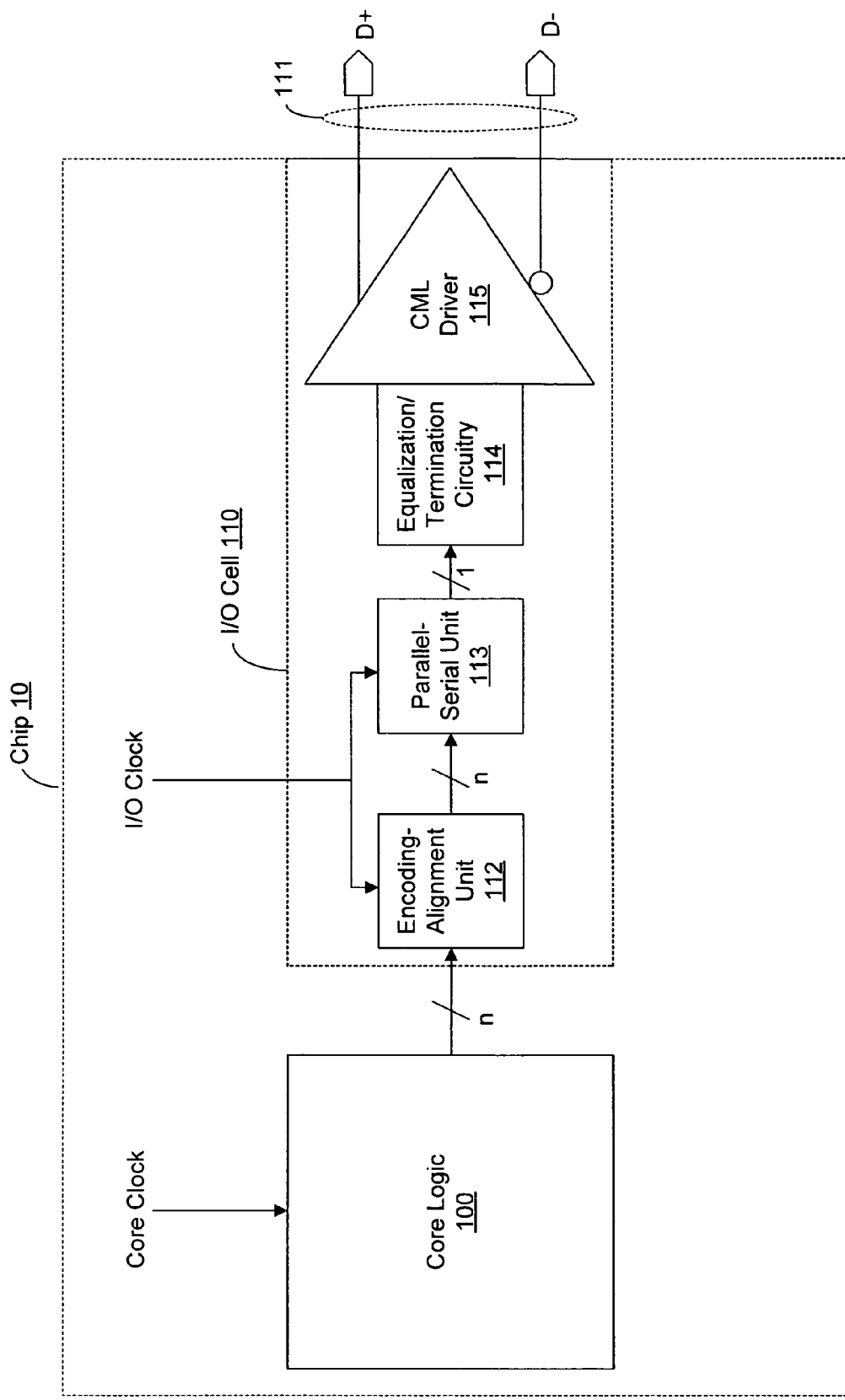
FIG. 3 is a block diagram of one embodiment of a transmit path between core logic of an IC and a plesiochronous transmitter.

Turning now to FIG. 3, a block diagram of one embodiment of a transmit path between core logic of an IC and a plesiochronous transmitter is shown. In the embodiment shown, Chip 10 includes core logic 100 and one or more I/O cells 110. It should be noted that, for the sake of simplicity, only one I/O cell 110 is shown here, although it is understood that additional instances of the same may be present.

Core logic 100 is configured to convey data to I/O cell over a data path that is n bits wide. The width n of the data path may be any suitable width, e.g., 8 bits, 16 bits, or the like. Data may be received in I/O cell 110 by encoding/alignment unit 112, which performs functions such as data alignment, bit stuffing, and encoding of the data for transmission. After performing these functions on n bits of received data, then bits are conveyed to parallel-serial unit 113, where the data is then converted from parallel data to serial data. The operation of both encoding/alignment unit 112 and parallel-serial unit 113 is synchronized to an I/O clock generated on chip 10. The operation of core logic 100 is synchronized to a core clock, which is also generated on chip 10. After conversion to serial, the data is conveyed over a 1-bit data line to equalization/termination circuitry 114. This circuitry may provide the necessary termination impedances to ensure integrity of the signals conveyed over the 1-bit data line, and may also provide data-dependent equalization (i.e. pre-emphasis) of signals to be transmitted from I/O cell 110. Furthermore, equalization/termination circuitry also converts single-ended signals received therein into differential signals. Thus, each bit of data is transmitted as a differential signal from CML (common mode logic) driver 115 over interconnect 111.

Figure 4:
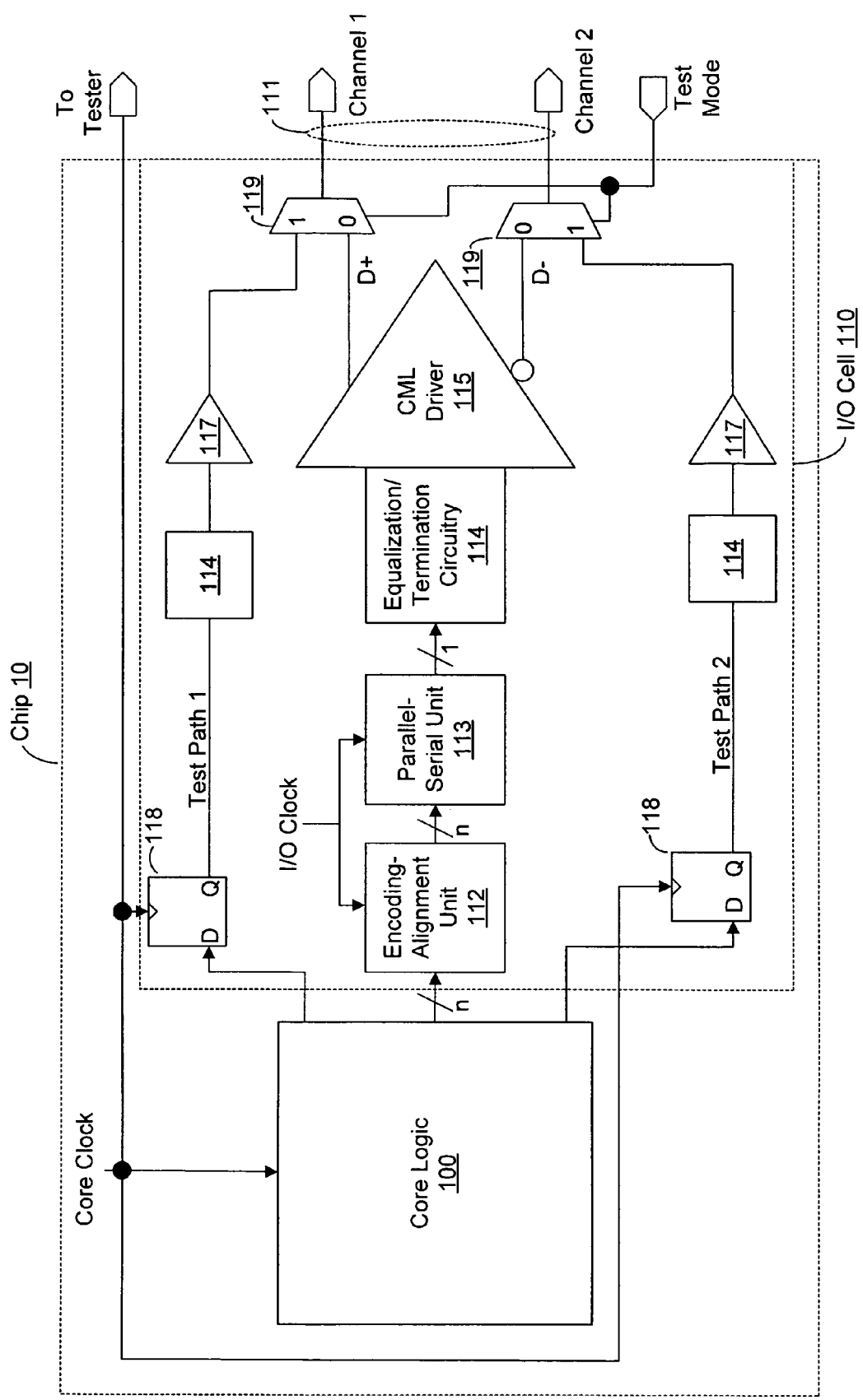
FIG. 4 is a block diagram of one embodiment of a plesiochronous transmit path from core logic to a plesiochronous transmitter further including a pair of alternate paths for synchronously transmitting data to ATE over two single-ended channels.
Figure 5:
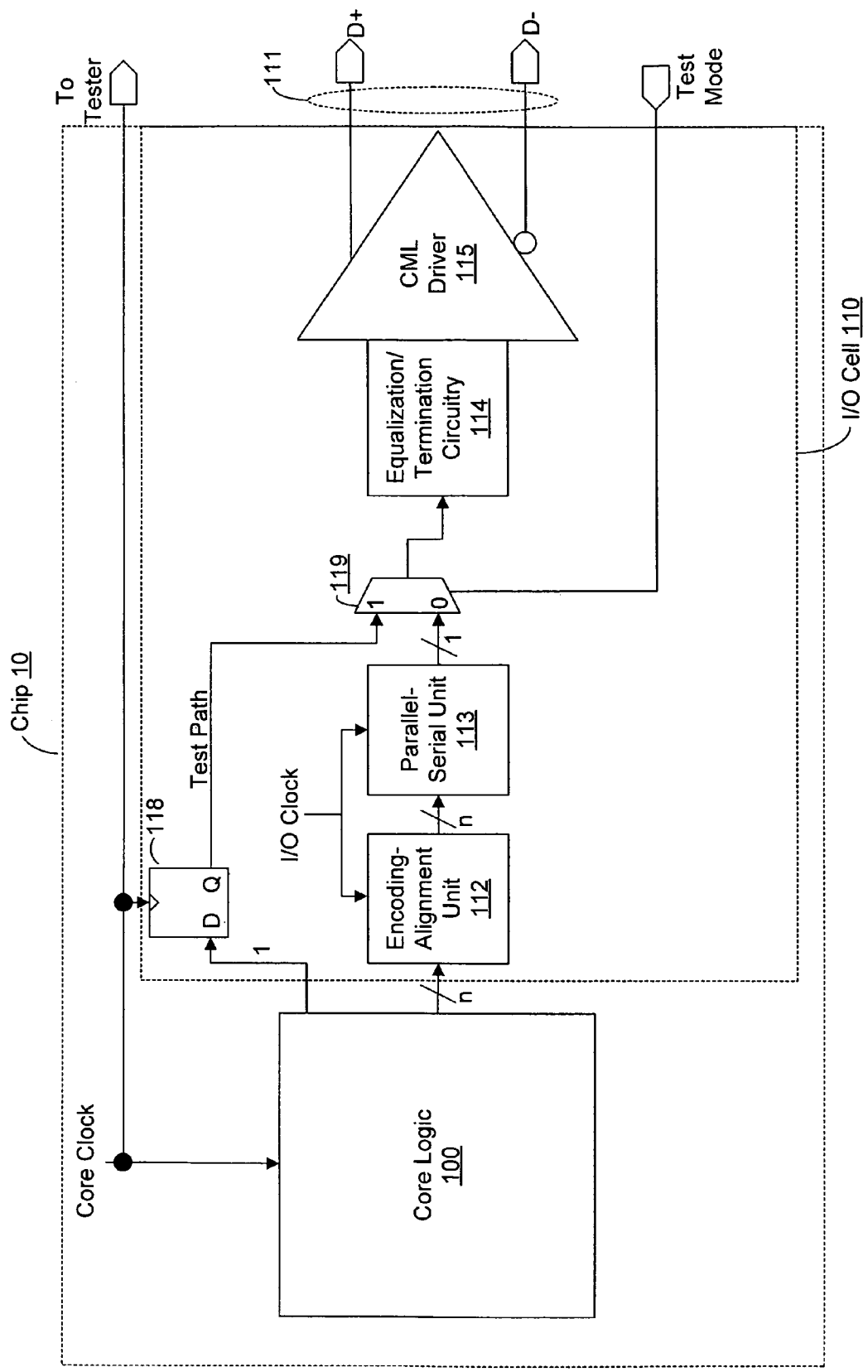
FIG. 5 is a block diagram of one embodiment of a plesiochronous transmit path from core logic to a plesiochronous transmitter including an alternate path for syncrhonously transmitting data to ATE over a differential channel.

The transmit path shown in FIG. 3 is used for transmitting data plesiochronously during normal operation. However, ATE systems such as that shown in FIGS. 1 and 2 are typically not configured to receive data plesiochronously. Thus, in testing a chip such as chip 10, there must be provided an alternate path for conveying test response data from the core logic 100 to the ATE system when operating in a test mode. FIGS. 4 and 5 illustrate alternate data paths for conveying test response data from core logic 100 to an ATE system that utilize the same interconnect 111 that is used for plesiochronous data transmissions in a normal mode of operation.

FIG. 4 is a block diagram of one embodiment of a plesiochronous transmit path from core logic to a plesiochronous transmitter further including a pair of alternate paths for synchronously transmitting data to ATE over two single-ended channels. In the embodiment shown, I/O cell 110 includes a transmit path similar to that shown in FIG. 3 for operating in a normal mode, but also includes alternate paths from core logic 100 to interconnect 111 for conveying test response data to an ATE system when operating in a test mode.

I/O cell 110 includes a pair of multiplexers 119 (i.e. selector circuits), one having an input coupled to the true output of CML driver 115 and the other having an inputs coupled to the complementary output. In the normal mode of operation, the test mode signal (which is provided to a select input of each multiplexer 119) is de-asserted, thereby selecting and coupling the CML driver outputs to their respective signal lines of interconnect 111 and enabling data to be transmitted plesiochronously by I/O cell 110 over interconnect 111.

During operation in the test mode (i.e. when chip 10 is undergoing test on an ATE system), the test mode signal is asserted by the tester, and thus selects the alternate paths (labeled as 'test path 1' and 'test path 2') at multiplexers 119. Test response data may be generated by core logic 100 by stimulus provided to chip 10 (e.g., via I/O cell 210 shown in FIG. 2) or by data generated from an internally initiated test routine.

In the embodiment shown, each test path is a single bit wide, and thus test response data is transmitted serially over the test paths and interconnect 111 to the ATE system. Furthermore, it is noted that each test path is a separate channel, i.e. test path 1 is associated with channel 1 (first pin connection of interconnect 111) and test path 2 is associated with channel 2 (second pin connection of interconnect 111). Test response data may be transmitted over each of these channels independently of the other channel.

Each test data path in the embodiment shown includes a flip-flop 118 having an input coupled to receive data from core logic 100. The output of each flip-flop 118 is coupled to an equalization/termination circuitry unit 114. The equalization/termination circuits 114 of the test paths may be different from that of the normal data path in that they are configured to provide termination and equalization of single-ended signals. Each test path further includes a driver 117 configured to receive data and drive it as a single ended signal over its respective pin connection of interconnect 111, via its respective multiplexer 119. In the embodiment shown, driver 117 is a full rail logic driver.

In the embodiment shown, core logic 100 and flip-flops 118 are synchronized to a core clock generated on chip 10. The core clock may also be conveyed to an ATE system over the shown core clock connection. Thus, test response data conveyed from chip 10 to an ATE system may be synchronized to the core clock on both the transmitter and receiver sides. If necessary to accommodate the ATE system or the connection of chip 10 thereto, the core clock may operate at a reduced frequency during the test mode.

Thus, the embodiment shown in FIG. 4 utilizes interconnect 111 to provide two independent single-ended channels for transmitting test response data from chip 10 to an ATE system coupled thereto when operating in a test mode. An alternate embodiment utilizing a single differential channel for conveying test response data to an ATE system will now be discussed.

FIG. 5 is a block diagram of one embodiment of a plesiochronous transmit path from core logic to a plesiochronous transmitter including an alternate path for synchronously transmitting data to ATE over a differential channel. In the embodiment shown, a single multiplexer 119 is arranged between parallel-serial unit 113 and equalization/termination circuitry 114. In the normal mode of operation, the test mode signal (which is provided to the select input of multiplexer 119) is de-asserted, thereby allowing data from parallel-serial unit 113 to be conveyed to equalization/termination circuitry 114, and thus transmitted plesiochronously over interconnect 111 by CML driver 115.

In the test mode, the test mode signal (conveyed from an ATE system) is asserted, thereby causing multiplexer 119 to select the test path. Test response data may be conveyed serially from core logic 100 to flip-flop 118, and then to equalization/termination circuitry 114 via multiplexer 119. Equalization/termination circuitry converts the single-ended test data signals into differential signals, which are then transmitted by CML driver 115 over interconnect 115.

As with the previously discussed embodiment of FIG. 4, the differential channel embodiment shown in FIG. 5 includes a connection to convey a core clock to an ATE system. The core clock is used to synchronize operation of both core logic 100 as well as flip-flop 118. Thus, test response data conveyed from chip 10 to an ATE system may be synchronized to the core clock on both the transmitter and receiver sides. As with the embodiment previously discussed above in reference to FIG. 4, the core clock may operate at a reduced frequency (with respect to its normal operating frequency) if necessary to accommodate the ATE system.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An integrated circuit comprising:
 a core logic unit;
 a first transmitter coupled to the core logic unit;
 an interconnect coupled to an output of the first transmitter;
 a first data path coupled between the core logic unit and the first transmitter, wherein, in a normal mode, the first transmitter is configured to receive data from the core logic unit and further configured to plesiochronously transmit said data over the interconnect; and
 a second data path, wherein, in a test mode, the core logic unit is configured to syncrhonously convey test response data over the second data path, wherein said test response data is syncrhonously transmitted to automated test equipment (ATE) via the interconnect.

2. The integrated circuit as recited in claim 1, wherein the second path is coupled between the core logic unit and the first transmitter.

3. The integrated circuit as recited in claim 2, wherein the first transmitter is configured to transmit differential signals over the interconnect, wherein the interconnect includes a first pin connection and a second pin connection.

4. The integrated circuit as recited in claim 3, wherein, in the test mode, the first transmitter is configured to transmit said test response data to the ATE over a differential channel.

5. The integrated circuit as recited in claim 1, wherein the integrated circuit further comprises a second transmitter coupled to the core logic unit by the second data path and a third transmitter coupled to the core logic unit by a third data path.

6. The integrated circuit as recited in claim 5, wherein the interconnect includes a first pin connection and a second pin connection, and wherein, in the test mode, the second and third transmitters are configured to conduct single-ended transmissions of the test response data via the first and second pin connections, respectively.

7. The integrated circuit as recited in claim 6, wherein the second and third data paths, the second and third transmitters, and the first and second pin connections comprise first and second single-ended channels, respectively.

8. The integrated circuit as recited in claim 1, wherein the integrated circuit is configured to generate a clock signal, and wherein the integrated circuit further includes a clock interconnection enabling the clock signal to be conveyed to the ATE.

9. The integrated circuit as recited in claim 8, wherein, in the test mode, test response data transmitted to the ATE is synchronized to the clock signal, wherein the second data path includes a flip-flop coupled to receive the clock signal, wherein the test response data is latched through the flip-flop.

10. The integrated circuit as recited in claim 1, wherein the integrated circuit includes a selector circuit configured to select the first path in the normal mode and the second path in the test mode, wherein the selector circuit is configured to receive a test mode signal from the ATE.

11. A method comprising:

in a normal mode, transmitting data plesiochronously over an interconnect, wherein said data is received by a first transmitter from a core logic unit via a first data path coupled therebetween and subsequently transmitted over the interconnect; and in a test mode, synchronously transmitting, over the interconnect, test response data received from the core logic unit to automated test equipment (ATE), wherein said test response data is conveyed from the core logic unit to the interconnect via a second data path.

12. The method as recited in claim 11, wherein the second path is coupled between the core logic unit and the first transmitter.

13. The method as recited in claim 12, wherein the first transmitter is configured to transmit differential signals over the interconnect, wherein the interconnect includes a first pin connection and a second pin connection.

14. The method as recited in claim 13 further comprising transmitting test response data from the first transmitter to the ATE over a differential channel.

15. The method as recited in claim 11 further comprising conveying test response data from the core logic unit to a second transmitter via the second data path and conveying test response data from the core logic unit to a third transmitter via a third data path.

16. The method as recited in claim 15, wherein the interconnect includes a first pin connection and a second pin connection, and wherein, in the test mode, the second and third transmitters are configured to conduct single-ended transmissions of the test response data via the first and second pin connections, respectively.

17. The method as recited in claim 16, wherein the second and third data paths, the second and third transmitters, and the first and second pin connections comprise first and second single-ended channels, respectively.

18. The method as recited in claim 11 further comprising generating a clock signal and conveying the clock signal to the ATE via a clock interconnection.

19. The method as recited in claim 18, wherein, in the test mode, test response data transmitted to the ATE is synchronized to the clock signal, wherein the second data path includes a flip-flop coupled to receive the clock signal, wherein the test response data is latched through the flip-flop.

20. The method as recited in claim 11, wherein the integrated circuit includes a selector circuit configured to select the first path in the normal mode and the second path in the test mode, wherein the selector circuit is configured to receive a test mode signal from the ATE.

* * * * *

UNITED STATES PATENT AND TRADEMARK OFFICE
CERTIFICATE OF CORRECTION

PATENT NO.      : 7,657,804 B2                                              Page 1 of 1
APPLICATION NO. : 11/582803
DATED           : February 2, 2010
INVENTOR(S)     : Ishwardutt Parulkar It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 751 days.

Signed and Sealed this

Thirtieth Day of November, 2010

David J. Kappos
*Director of the United States Patent and Trademark Office*